(12) United States Patent
Kakuchi et al.

(10) Patent No.: US 7,276,717 B2
(45) Date of Patent: Oct. 2, 2007

(54) MEASURING APPARATUS, EXPOSURE APPARATUS AND DEVICE MANUFACTURING METHOD

(75) Inventors: Osamu Kakuchi, Kasama (JP); Yoshiyuki Kuramoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 70 days.

(21) Appl. No.: 11/267,561

(22) Filed: Nov. 4, 2005

(65) Prior Publication Data
US 2006/0097205 A1 May 11, 2006

(30) Foreign Application Priority Data
Nov. 5, 2004 (JP) ............................. 2004-322997

(51) Int. Cl.
*G03B 27/42* (2006.01)
*G01B 11/02* (2006.01)

(52) U.S. Cl. ................... 250/548; 355/53; 356/515

(58) Field of Classification Search ............... 250/548, 250/216, 573; 355/53, 67, 75; 356/512–515
See application file for complete search history.

(56) References Cited

U.S. PATENT DOCUMENTS

2002/0118370 A1 8/2002 Nishida ................. 356/515
2003/0128346 A1 7/2003 Murakami et al. ......... 355/53
2005/0099635 A1 5/2005 Kakuchi et al. ........... 356/515

FOREIGN PATENT DOCUMENTS

| JP | 2000-277411 | 10/2000 |
|---|---|---|
| JP | 2000-277412 | 10/2000 |
| JP | 2001-074605 | 3/2001 |
| JP | 2002-071513 | 3/2002 |
| JP | 2002-250678 | 9/2002 |
| JP | 2004-245744 | 9/2004 |
| JP | 2004-297046 | 10/2004 |
| WO | WO2004/053959 A1 * | 6/2004 |

* cited by examiner

*Primary Examiner*—Kevin Pyo
(74) *Attorney, Agent, or Firm*—Morgan & Finnegan, L.L.P.

(57) ABSTRACT

A measuring apparatus for measuring optical performance of a target optical system to be measured includes an optical unit for splitting light from a light source into measuring light and reference light so that the measuring light can be introduced into the target optical system, a reflection unit for reflecting the measuring light from the target optical system toward the target optical system via a fluid, and a detector for detecting an interference fringe generated between interference between the measuring light that has emitted from the target optical system after being reflected by the reflection unit and the reference light that does not pass the target optical system.

18 Claims, 7 Drawing Sheets

PRIOR ART

MEASURING APPARATUS, EXPOSURE APPARATUS AND DEVICE MANUFACTURING METHOD

BACKGROUND OF THE INVENTION

The present invention relates generally to a measuring apparatus and an exposure apparatus having the same, which measures the optical performance of an optical element, such as a wavefront aberration and a Zernike coefficient. More specifically, the present invention relates to a measuring apparatus and an immersion exposure apparatus having the same, which measures the optical performance of a projection optical system in an immersion exposure apparatus.

An interferometer as an optical-performance measuring apparatus measures the optical performance of the projection optical system, without filling the fluid or liquid in the space between the projection optical system and the wafer, in the conventional immersion exposure apparatus. Rather, the space is filled with air and a large spherical aberration occurs due to a refractive index difference between the air and the fluid. In this case, the interference fringes are too dense to measure or to precisely measure. Therefore, the wavefront aberration is measured after a spherical aberration, a non-axial coma, and the like are minimized by adjusting the height of the object plane of the projection optical system or reticle surface, and the intervals among the optical elements, such as a lens and a mirror, in the projection optical system. Prior art include Japanese Patent Publications, Application Nos. 2001-074605 and 2002-071513, and 2002-250678.

Referring now to FIG. 7, a description will be given of details of a conventional optical-performance measuring apparatus. A target optical system 115 to be measured guides the light from a light source 101 having a good coherency and an oscillation wavelength close to a usable wavelength of the target optical system 15, such a laser light source, to an interferometer unit 102. The light from the light source 101 is split into measuring light and reference light in the middle of the optical path. As to the optical path of the measuring light, a condenser lens 103 condenses the light onto a spatial filter 104 in the interferometer unit 102. A diameter of a spatial filter 104 is set to about half an airy disc diameter determined by a numerical aperture ("NA") of a collimeter lens 106. Thereby, the exited light from the spatial filter 104 becomes an ideal spherical wave, passes a half-mirror 105, is converted by the collimeter lens 106 into collimated light, and exits from the interferometer unit 102.

Then, the measuring light is guided to a top of the object plane of the target optical system 105 via a deflective optical system 110, and incident upon TS-XYZ stages 122-124. A mirror 111 fixed on the stage base 121 reflects the light in the Y direction, a Y moving mirror 112 on the TS-Y stage 122 reflects the light in the X direction, and a X-moving mirror 113 on a TS-X stage 123 reflects the light in the Z direction. A TS lens 114 on the TS-Z stage 121 condenses the light upon the object plane of the target optical system 115, and the light re-images on the image plane (wafer surface) via the target optical system 115.

The object plane shifts along an optical-axis direction to the reticle surface in the exposure apparatus. Since the fluid is not filled in the space, the spherical aberration occurs on the normal object plane position and a measurement of the precise wavefront aberration becomes difficult. The position of the object plane is set so that the spherical aberration is minimized.

Thereafter, an RS mirror 132 on RS-XYZ stages 125-127 reflects the light, and the light goes back to the interferometer unit 102 via the target optical system 115, the TS lens 114, the mirrors 113-111 and the deflective optical system 110.

The measuring light is incident upon the interferometer unit 102 and the collimeter lens 106, reflected by the half-mirror 105, and condensed upon the spatial filter 107. The spatial filter 107 shields the stray light and a steep slope wavefront. The light passes the spatial filter 107, and is incident upon the CCD camera 109 via the imaging lens 108.

On the other hand, the reference light is incident upon the TS lens 114 from the X moving mirror 113, and the part of the light is reflected on the TS lens 114. The surface reflection light from a Fizeau surface as a final surface of the TS lens 114 goes back along the same optical path, and is incident as the reference light upon the CCD camera 109. A superposition of the reference light and measuring light forms interference fringes.

The TS-XYZ stages 122-124 and RS-XYZ stages 125-127 move to an arbitrary image-point position of the target optical system 115 based on a command from the host computer 131 via a controller 130, a TS-XYZ stage driver 128, and an RS-XYZ stage driver 129.

This configuration enables the wavefront aberration to be continuously measured at arbitrary image points in the exposure area.

However, the above conventional optical-performance measuring apparatus has difficulties in canceling all the axial and non-axial aberrations, such as low and high orders spherical aberrations and non-axial coma, resulting in the increased aberrational residues as the target optical system has a high NA. As a result, the fringe interval in the interference fringes are denser than the spatial resolution of the interferometer and the wavefront aberration cannot be measured. The measuring accuracy generally lowers with a magnitude of the target wavefront, and the wavefront can be measured but not precisely.

BRIEF SUMMARY OF THE INVENTION

Accordingly, the present invention is directed to a measuring apparatus and an exposure apparatus having the same, which precisely measures the optical performance (such as a wavefront aberration and a Zernike coefficient) of a target optical system (such as a projection optical system in an immersion exposure apparatus). More specifically, the present invention is directed to a measuring apparatus and an exposure apparatus having the same, which fills the fluid in the fluid material in an image space of the target optical system, reproduces the operating condition of the immersion exposure apparatus, and precisely measures the optical performance.

A measuring apparatus according to one aspect of the present invention for measuring optical performance of a target optical system to be measured includes an optical unit for splitting light from a light source into measuring light and reference light so that the measuring light can be introduced into the target optical system, a reflection unit for reflecting the measuring light from the target optical system toward the target optical system via a fluid, and a detector for detecting an interference fringe generated between interference between the measuring light that has emitted from the target optical system after being reflected by the reflection unit and the reference light that does not pass the target optical system.

An exposure apparatus according to another aspect of the present invention includes an illumination optical system for illuminating a reticle, a projection optical system for projecting a pattern of the reticle onto a substrate, and the above measuring apparatus for measuring optical performance of the projection optical system as a target optical system.

A device manufacturing method according to still another aspect of the present invention includes the steps of exposing a substrate using the above exposure apparatus, and developing the object that has been exposed.

Other objects and further features of the present invention will become readily apparent from the following description of the preferred embodiments with reference to accompanying drawings.

DETAILED DESCRIPTION OF THE PREFERRED EMBODIMENTS

First Embodiment

Figure 1:
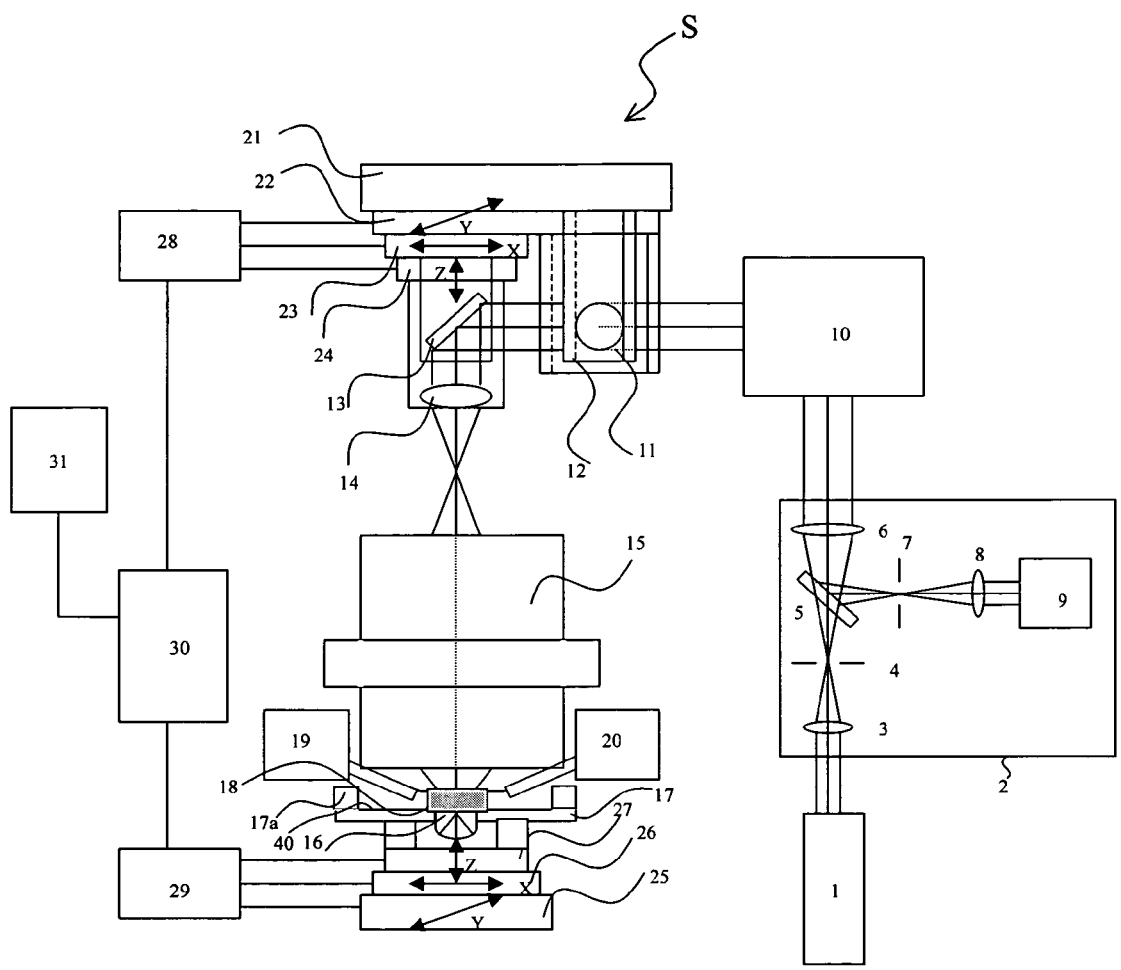
FIG. 1 is a schematic block diagram of a structure of an optical-performance measuring apparatus according to a first embodiment of the present invention.

Referring now to the accompanying drawings, a description will be given of an optical-performance measuring apparatus or interferometer according to a first embodiment of the present invention. FIG. 1 is a schematic block diagram of a structure of the optical-performance measuring apparatus S according to the first embodiment of the present invention. The optical-performance measuring apparatus S introduces the light that has a good coherency and an oscillation wavelength close to the usable wavelength of the target optical system 15, from a light source, such as a laser light source, to an interferometer unit 2. The light from the light source 1 is split in the middle of the optical path into measuring light and reference light. As to the optical path of the measuring light, a condenser lens 3 condenses a light upon the spatial filter 4 in the interferometer unit 2. The spatial filter 4 has a diameter about half an airy disc diameter determined by the NA of a collimeter lens 6, whereby the exited light from the spatial filter 4 becomes an ideal spherical wave, passes the half-mirror 5, is converted by the collimeter lens 6 into a collimated light, and exits from the interferometer unit 2.

Next, a deflective optical system 10 guides the measuring light to the top of the object plane of a target optical system 15, and the light then enters TS-XYZ stages 22-24. A mirror 11 fixed on a stage base 21 reflects the light to the Y direction, a Y moving mirror 12 fixed on a TS-Y stage 22 reflects the light in the X direction, and a X moving mirror 13 on a TS-X stage 23 reflects the light in the Z direction. The light is condensed on the object plane of the target optical system 14 by a TS lens 14 on the TS-Z stage 21, and re-images on the image plane (wafer plane, see FIG. 2) via the target optical system 15.

Thereafter, a reflection element or optical system 16 on the RS-XYZ stages 25-27 reflects the light, and the light goes back to the interferometer unit 2 via the target optical system 15, the TS lens 14, the mirrors 13-11 and the deflective optical system 10.

The measuring light is incident upon the interferometer unit 2 and the collimeter lens 6, reflected by the half-mirror 5, and condensed upon the spatial filter 7. The spatial filter 7 shields the stray light and a steep slope wavefront. The light passes the spatial filter 107, and is incident upon the CCD camera (or detector) 9 via an imaging lens 8.

On the other hand, the reference light is incident upon the TS lens 14 from the X moving mirror 13, and the part of the light is reflected on the TS lens 14. The surface reflection light from a Fizeau surface as a final surface of the TS lens 14 goes back along the same optical path, and is incident as the reference light upon the CCD camera 9. A superposition of the reference light and measuring light forms interference fringes.

The TS-XYZ stages 22-24 and RS-XYZ stages 25-27 move to an arbitrary image-point position of the target optical system 15 based on a command from a host computer 31 via a controller 130, a TS-XYZ stage driver 28, and an RS-XYZ stage driver 29.

As a result, the optical-performance measuring apparatus S can continuously measure the wavefront aberration at an arbitrary image point in the exposure area.

While the optical-performance measuring apparatus S is similarly configured to the conventional one, the optical-performance measuring apparatus S further includes the reflection element 16, a plane-parallel plate 17, a fluid supply system 19, and a fluid recovery system 20 near the wafer side or the image plane 201 side of the target optical system 15. A description will now be given of their structures with reference to FIG. 2.

Figure 2:
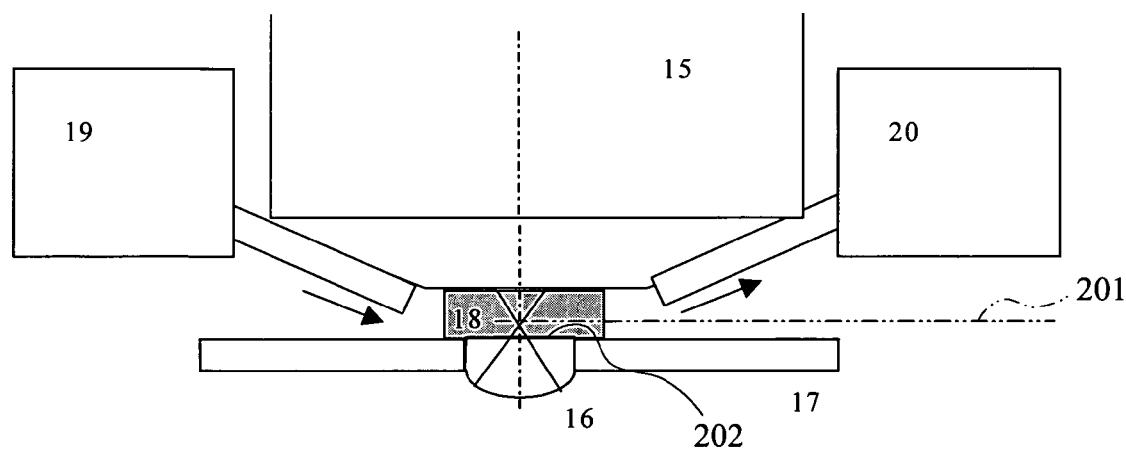
FIG. 2 is an enlarged view of principal part near a reflecting element in the optical-performance measuring apparatus shown in FIG. 1.

FIG. 2 is an enlarged view of principal part of the optical-performance measuring apparatus S near the reflection element 16. The reflection element 16 reflects the light from the target optical system 15 so as to redirect the light to the target optical system 15, and is made of a transparent material. The reflection element 16 has a plane surface 202 opposing to the target optical system 15, and a planoconvex reflection element having a convex surface opposing to the plane surface 202. The light from the target optical system 15 is incident upon the inside of the reflection element 16 through its plane surface 202, and exits from the plane surface 202 after being reflected on the convex surface. Thus, the convex surface of this reflection element 16 internally reflects the measuring light, and serves as a condenser optical system for the measuring light. In this case, a reflective coating is formed at the convex surface side to avoid a loss of the measuring light intensity.

The reflection element 16 is adhered or welded to the transparent plane-parallel plate 17 made of glass or metal. A material having a large contact angle with the (immersion) fluid or liquid 18 is coated or arranged on the plane-parallel plate 17, thereby forming a fluid film even when the reflection element 16 has a small contact angle to the fluid 18. When the reflection element is made of $SiO_2$, the contact angle is so small that a fluid film formation becomes difficult whereas the surrounding Teflon coating enables the fluid film to be formed.

The image space between the reflection element 16 and the target optical system 15 is filled with the fluid 18, enabling the optical-performance measuring apparatus S to reproduce the operating condition of the target optical system 15 in the immersion exposure apparatus.

The fluid 18 is supplied from the fluid supply system 19, and recovered by the fluid recovery system 20. As shown in FIG. 2, in order to prevent the fluid 18 from flowing out of a stage part 40 of the plane-parallel plate 17 to the outside, the plane-parallel plate 17 has a low wall material 17a. The plane-parallel plate 17 and the reflection element 16 are adhered or welded to each other as discussed above so that no fluid leaks out between them. The plane-parallel plate 17 and the reflection element 16 are arranged on the RS-XYZ stages 25-27, which move them to an arbitrary image point of the target optical system 15.

When the target optical system 15 is a projection optical system for the ArF excimer laser, water is used for the fluid 18 and calcium fluoride ($CaF_2$) or synthetic quartz ($SiO_2$) is used for the reflection element 16. When the reflection element 16 uses calcium fluoride, an antireflection coating is formed on calcium fluoride at contact portion to prevent its dissolution into water. When the reflection element 16 uses synthetic quartz, compaction and rarefaction measures are needed and it is necessary to prevent the light from condensing inside the reflection element 16. The reflection element 16 should oppose to the target optical system 15 on its plane surface 202 side, and the image surface 201 of the target optical system 15 should be arranged between the plane surface 202 of the reflection element 16 and the target optical system 15 or above the plane surface 202 of the reflection element 16. As a result, when the convex surface of the reflection element is spherical, the maximum thickness of the reflection element 16 should be made smaller than the radius of curvature of the convex surface of the reflection element 16. When the convex surface of the reflection element is made aspheric in order to reduce the aberration, the thickness of the reflection element 16 should be made smaller than a distance between the convex surface and the condensing point or a double focal length. As discussed above, the defocus amount between the reflection element 16 and the condensing point is important to not only the compaction measures but also the ghost measures in the interference measurement. A diameter of the ghost fringe should preferably be about 1% or smaller of the pupil diameter, and the defocus amount should be greater than 0.6 mm when the NA is 1.2, for example. Conversely, this defocus amount satisfies the compaction condition (of 0.1 mm or smaller).

The condensing point is formed in the fluid 18. Therefore, the fluid 18's refractive index varies due to its temperature rise resulting from the light energy absorptions or its temperature fluctuation resulting from the heat conduction from the structure around the fluid 18, and the measuring errors occur in measuring the wavefront aberration. Accordingly, the velocity of the fluid 18 is controlled through the fluid supply and recovery systems 19 and 20 so that the fluid 18 moves at a constant speed in the image space in the wavefront aberration measurement. Preferably, the velocity V of the fluid 18 satisfies the following Equation (1), $$V > D \times X \quad (1)$$

D is a maximum width (mm) of the measuring light in the fluid 18, and X is a detecting frame rate (Hz) of the detector or CCD camera 9.

This configuration averages the influence of the fluctuating refractive index distribution of the fluid 18 that results from the temperature rise particularly near the condensing point, in the frame rate of the CCD camera 9, and reduces the measuring error caused by the refractive index fluctuation.

Since a refractive index difference between the reflection element 16 and the fluid 18 is known, the spherical aberration caused by a difference of refractive indexes is correctable, for example, by turning a reflective spherical surface into an aspheric convex surface, or a reflective plane into a spherical or aspheric surface. Alternatively, the low order aberration is correctable by adjusting an object surface in an optical-axis direction so that the spherical aberration becomes minimum. These configurations can minimize the aberration at the wavefront measuring time, and provide excellent aberrational measurement.

A correction to a position of the object plane or reticle surface along the optical-axis direction to minimize the spherical aberration maintains the measuring reciprocity and thus the good measurement irrespective of the disturbance.

A distance between the center of curvature of the convex surface and the plane surface of the reflection element 16 is preferably 0.6 mm or greater, because the reflected light from the plane surface of the reflection element 16 becomes ghost and deteriorates the measuring accuracy. The distance of 0.6 mm or greater maintains the wavefront-accuracy deteriorating area caused by the ghost influence to be 1% or smaller of the pupil radius with no substantial problem.

Second Embodiment

Figure 3:
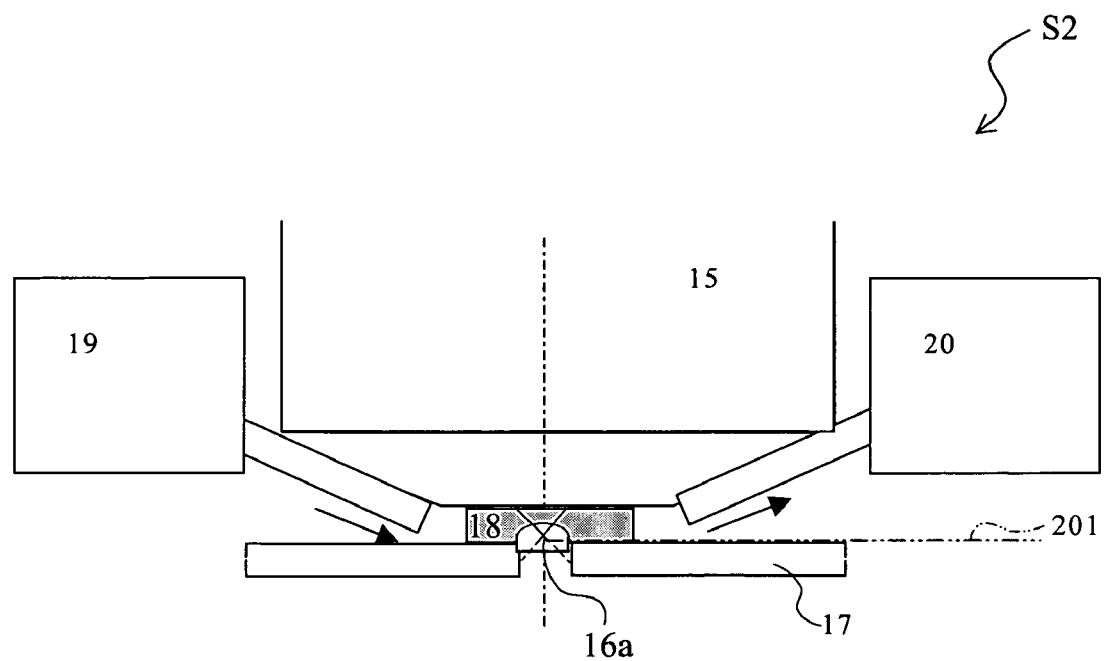
FIG. 3 is an enlarged view of principal part near a reflecting element in an optical-performance measuring apparatus according to a second embodiment of the present invention.

Referring to FIG. 3, a description will be given of an optical-performance measuring apparatus S2 according to a second embodiment of the present invention. While the first embodiment uses a planoconvex lens for the reflection element 16 that has a plane surface 202 opposing to the target optical system 15 and a convex surface opposite to the plane surface 202, this embodiment uses a convex reflector 16a for the reflection element 16 having a reflective convex surface opposing to the target optical system 15. The first embodiment arranges the plane surface 202 of the reflection element 16 at a defocus position by a predetermined distance from the image plane 201 position of the target optical system 15 to reduce the temperature rise near the condensing point or to avoid the compaction of the reflection element 16. This configuration elongates the optical path in the fluid 18, and may increase the influence of the fluctuation. However, this embodiment arranges the convex reflector 16a above the image plane 201 position of the target optical system 15 as shown in FIG. 3 or so that the measuring light is reflected by the convex surface of the convex reflector 16a before reaching the image plane 201 position. This configuration reduces the fluctuation influence associated with the temperature rise and elongated optical path in the fluid 18. For example, when the target optical system 15 is a projection optical system for the ArF excimer laser, the back focus is about 1 mm. Therefore, the radius of curvature of the convex surface of the convex reflector 16a should be made smaller than 1 mm.

The reflection element 16 may have a so-called spherical concave surface RS used for a normal interference measurement, and fills the fluid.

Third Embodiment

Figure 4:
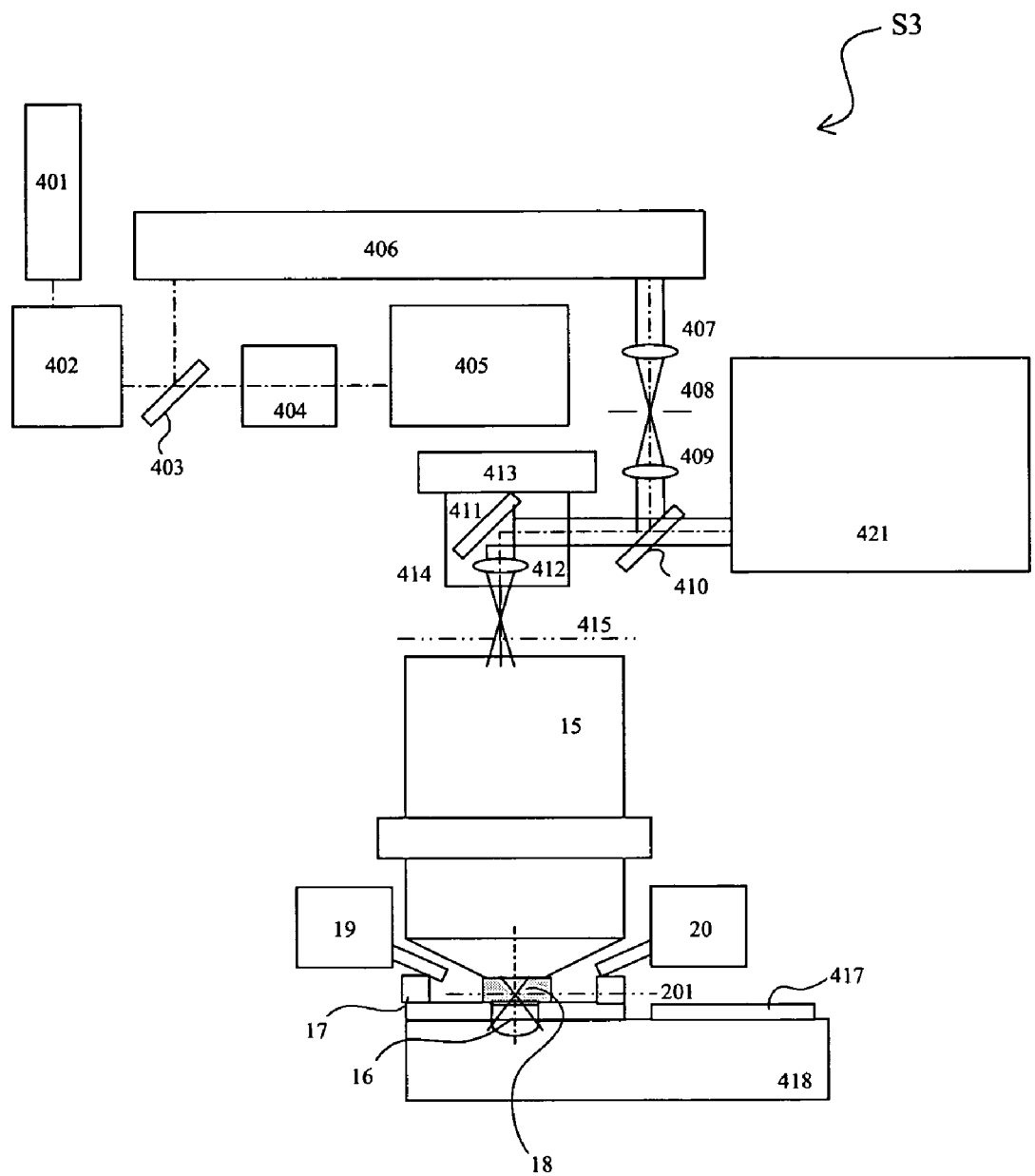
FIG. 4 is a schematic block diagram of a structure of an exposure apparatus according to a third embodiment of the present invention.

Referring now to FIG. 4, a description will be given of the exposure apparatus S3 according to a third embodiment of the present invention. The exposure apparatus S3 has a structure similar to that disclosed in U.S. Patent application, Publication No. 2005-0099635-A1, and includes the optical-performance measuring apparatus S1 according to the first embodiment. In FIG. 4, reference numeral 401 denotes an exposure light source, 402 and 406 denote deflective optical systems, 403 denotes an optical-path switching mirror, 404 denotes an incoherent turning unit, 405 denotes an illumination optical system, 407 denotes a condenser lens, and 408 denotes a spatial filter. 409 and 412 denote collimeter lenses, 410 denotes a half-mirror, 411 denotes a mirror, 413 denotes an XYZ stage, 414 denotes a collimeter lens unit, 415 denotes a reticle surface. Those elements, which are corresponding elements in the first embodiment, are designated by the same reference numerals of the first embodiment.

The plane-parallel plate 17 and the reflection element 16 adhered or welded to the plane-parallel plate 17, which are referred to as an immersion reflection unit, are arranged on a wafer stage 418 of the exposure apparatus S3. The optical-path switching mirror 403 is switched to the side of the optical-performance measuring optical path so that the light from the exposure light source 401 enters the deflective optical system 406. The light is guided to the reticle surface 415 via the deflective optical system 406, and the projection or target optical system 15 re-images the light on the wafer surface 201. The wafer stage 418 moves the reflection element 16 so that the condensing point (or center of curvature) of the reflection element 16 accords with the wafer surface 201. Next, the measuring light is reflected by the convex surface of the reflection element 16, goes back to the projection optical system 15 and then the inside of the interference optical system 421. A detecting means, such as a CCD camera, provided in the interference optical system 421 detects the interference fringes, and measures the wave-front aberration and Zernike coefficient of the projection optical system 15.

The projection optical system 15 may use a dioptric optical system that includes only plural lenses, a catadioptric optical system that includes one mirror and plural lenses, and a catoptric optical system that includes only plural mirrors.

While the above embodiment bypasses the light from the light source to the deflective optical system 406, the light irradiated onto the reticle surface may be used to measure the optical performance via the illumination optical system 405 in the exposure apparatus as long as the necessary light intensity is secured to measure the optical performance on the CCD camera.

Fourth Embodiment

Figure 5:
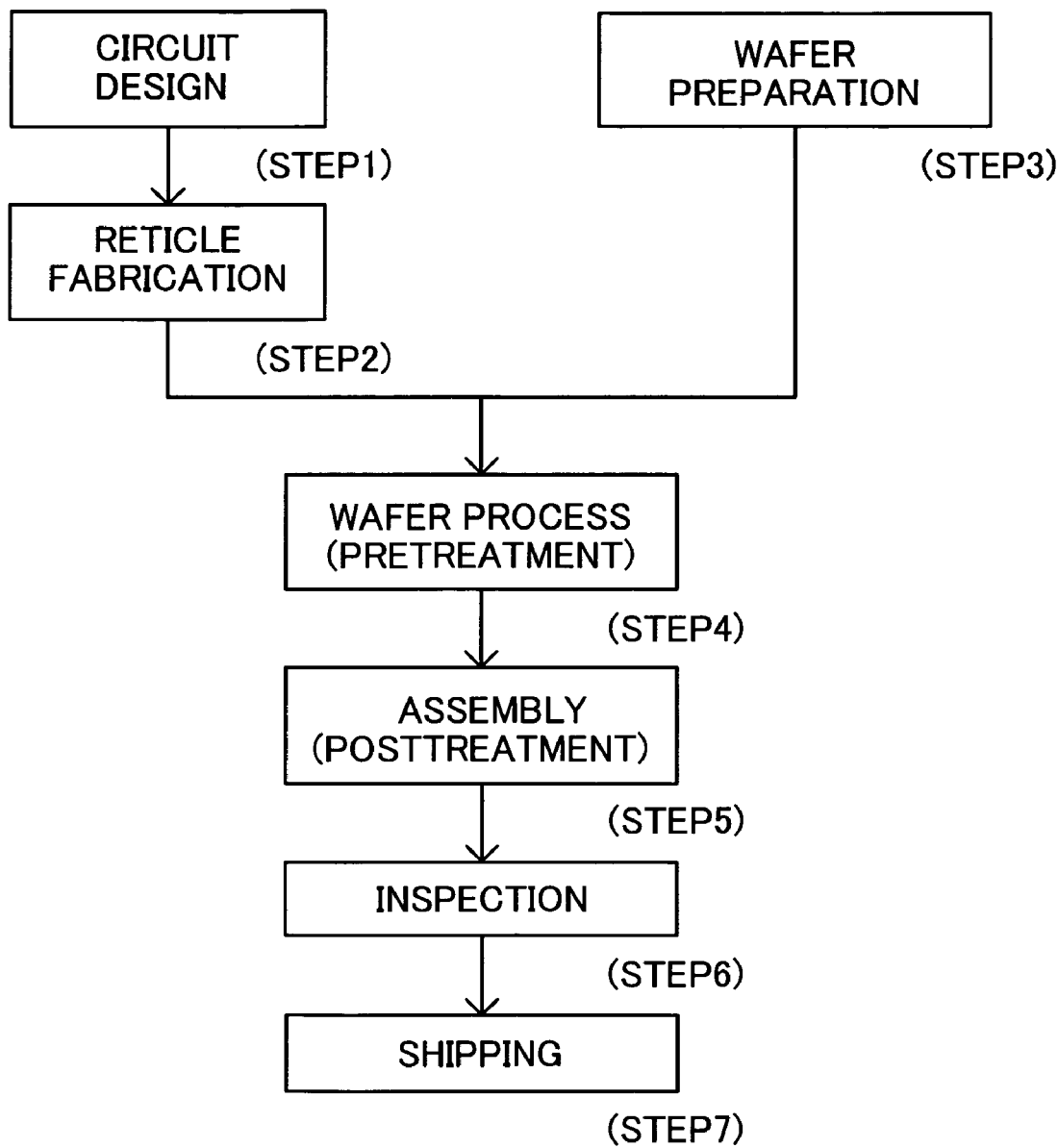
FIG. 5 is a flowchart of a device manufacturing method using the exposure apparatus shown in FIG. 4.
Figure 6:
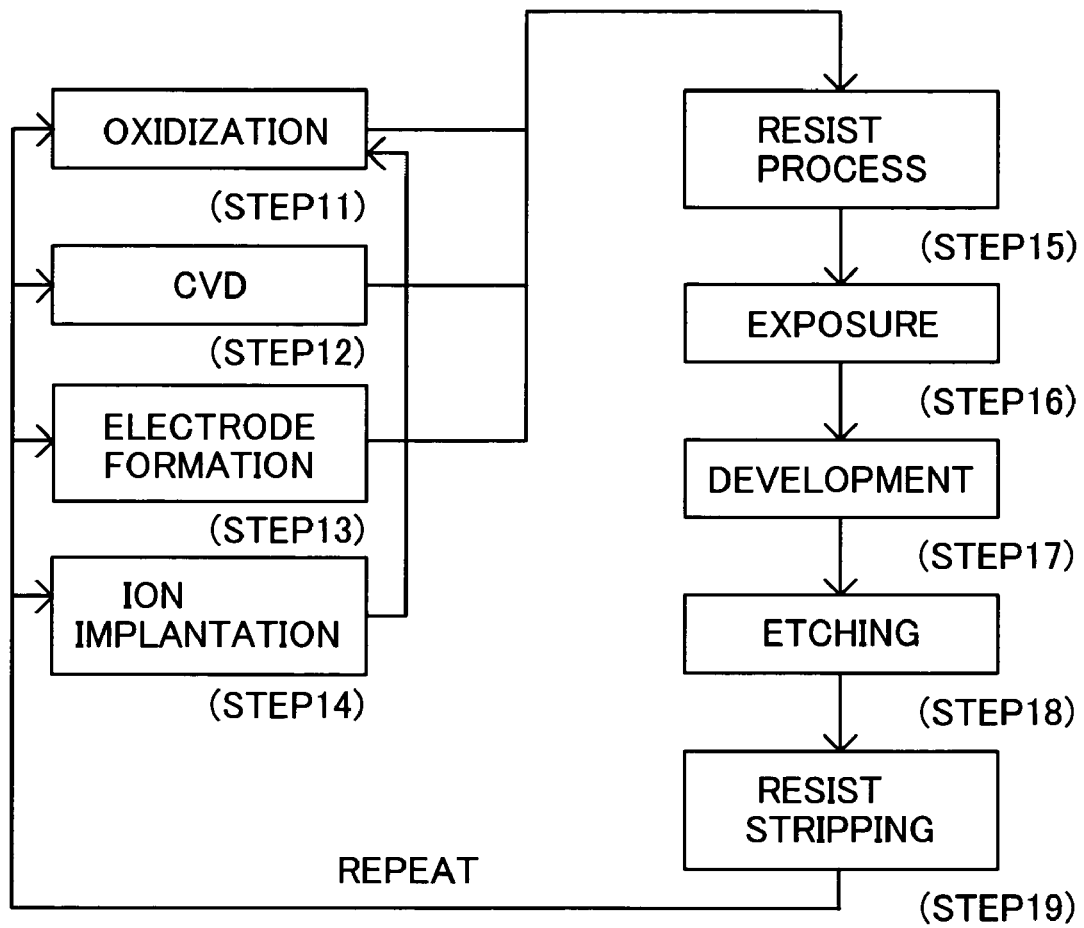
FIG. 6 is a detailed flowchart for Step 104 of wafer process shown in FIG. 5.
Figure 7:
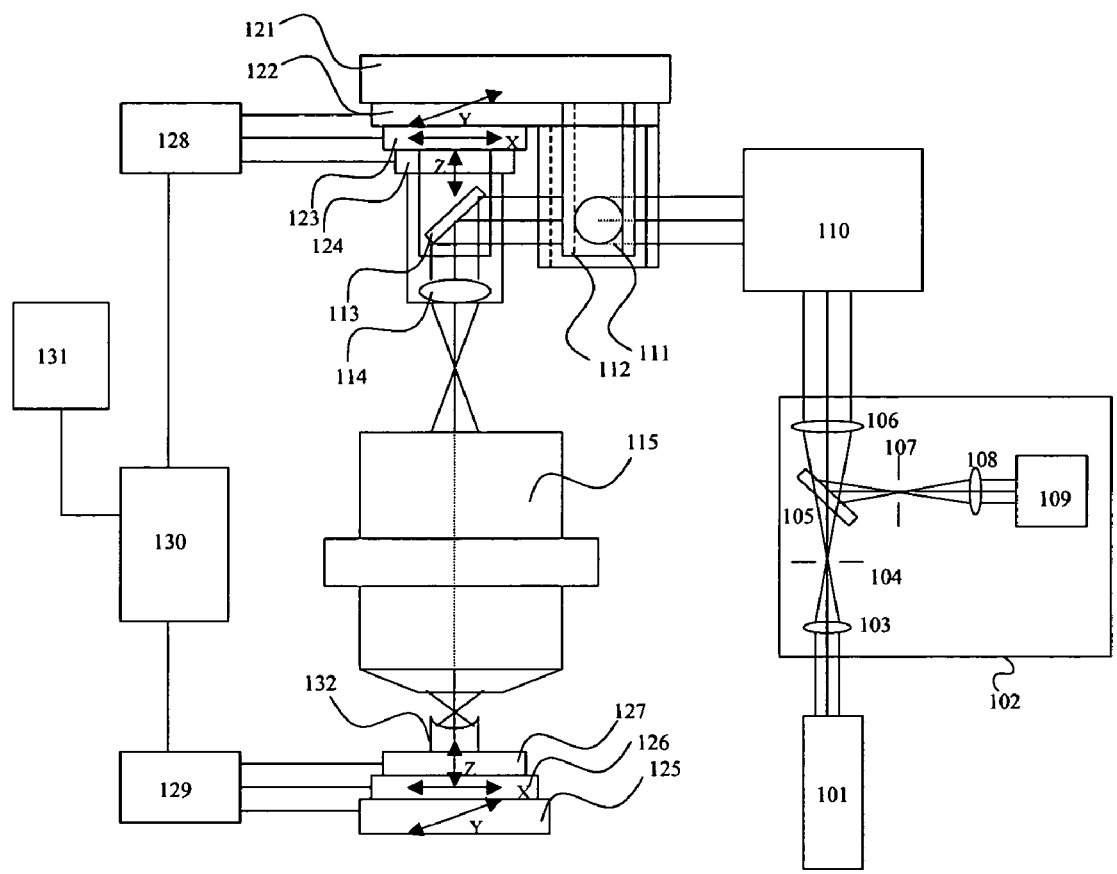
FIG. 7 is a schematic block diagram of a structure of a conventional optical-performance measuring apparatus.

Referring now to FIGS. 5 and 6, a description will now be given of an embodiment of a device manufacturing method using the above exposure apparatus S3. FIG. 5 is a flowchart for explaining a fabrication of devices (i.e., semiconductor chips such as IC and LSI, LCDs, CCDs, etc.). Here, a description will be given of a fabrication of a semiconductor chip as an example. Step 101 (circuit design) designs a semiconductor device circuit. Step 102 (mask fabrication) forms a mask having a designed circuit pattern. Step 103 (wafer preparation) manufactures a wafer using materials such as silicon. Step 104 (wafer process), which is referred to as a pretreatment, forms actual circuitry on the wafer through photolithography using the mask and wafer. Step 105 (assembly), which is also referred to as a post-treatment, forms the wafer formed in Step 104 and includes an assembly step (e.g., dicing, bonding), a packaging step (chip sealing), and the like. Step 106 (inspection) performs various tests for the semiconductor device made in Step 105, such as a validity test and a durability test. Through these steps, a semiconductor device is finished and shipped (Step 107).

FIG. 6 is a detailed flowchart of the wafer process in Step 104. Step 111 (oxidation) oxidizes the wafer's surface. Step 112 (CVD) forms an insulating film on the wafer's surface. Step 113 (electrode formation) forms electrodes on the wafer by vapor disposition and the like. Step 114 (ion implantation) implants ions into the wafer. Step 115 (resist process) applies a photosensitive material onto the wafer. Step 116 (exposure) uses the exposure apparatus S3 to expose a mask pattern onto the wafer. Step 117 (development) develops the exposed wafer 47. Step 118 (etching) etches parts other than a developed resist image. Step 119 (resist stripping) removes disused resist after etching. These steps are repeated, and multilayer circuit patterns are formed on the wafer. The manufacturing method of this embodiment can quickly and easily obtain the imaging performance of the projection optical system without lowering the exposure throughput, and utilize the projection optical system whose wave front aberration has been highly precisely corrected. The projection optical system whose wave front aberration has been highly precisely corrected can provide an alignment for the wafer stage with high precision. Therefore, the manufacture method of this embodiment can manufacture higher-quality devices than the conventional ones.

Further, the present invention is not limited to these preferred embodiments, and various variations and modifications may be made without departing from the scope of the present invention.

This application claims a foreign priority based on Japanese Patent application No. 2004-322997, filed Nov. 5, 2004, which is hereby incorporated by reference herein.

What is claimed is:

1. A measuring apparatus for measuring optical performance of a target optical system to be measured, said measuring apparatus comprising:
    an optical unit for splitting light from a light source into measuring light and reference light so that the measuring light can be introduced into the target optical system;
    a reflection unit for reflecting the measuring light from the target optical system toward the target optical system via a fluid; and
    a detector for detecting an interference fringe generated between interference between the measuring light that has emitted from the target optical system after being reflected by said reflection unit and the reference light that does not pass the target optical system;
    wherein said reflection unit is a condenser optical system that provides a condensing point on an image plane of the target optical system; and
    wherein the fluid meets $V > D \times X$, where V is a constant moving speed of the fluid, D is a maximum width (mm) of the measuring light in the fluid, and X is a detecting frame rate (Hz) of said detector.

2. A measuring apparatus according to claim 1, wherein the condensing point is arranged in the fluid that is filled in a space between the target optical system and said reflection unit.

3. A measuring apparatus according to claim 1, wherein said reflection unit is an optical element that has a predetermined surface and a convex surface,
wherein the measuring light from the target optical system is incident upon the optical element via the predetermined surface, and internally reflected by the convex surface.

4. A measuring apparatus according to claim 3, wherein the optical element is made of synthetic quartz.

5. A measuring apparatus according to claim 3, wherein the optical element is made of calcium fluoride ($CaF_2$), and the predetermined surface is provided with an antireflection coating.

6. A measuring apparatus according to claim 3, wherein the optical element is made of low-expansion glass.

7. A measuring apparatus according to claim 3, wherein the convex surface is an aspheric surface.

8. A measuring apparatus according to claim 3, wherein the predetermined surface is one of a plane surface, a spherical surface or an aspheric surface.

9. A measuring apparatus according to claim 3, wherein the convex surface is a spherical surface having a center of curvature arranged on an image plane of the target optical system.

10. A measuring apparatus according to claim 3, wherein a distance between a center of curvature of the convex surface and the predetermined surface is 0.6 mm or greater.

11. A measuring apparatus according to claim 8, wherein a radius of curvature of the convex surface is greater than a maximum thickness of the optical element.

12. A measuring apparatus according to claim 1, wherein said reflection unit is a single convex reflection element having a convex surface, and the measuring light from the target optical system is reflected on the convex surface.

13. A measuring apparatus according to claim 1, wherein said reflection unit is a single concave reflection element having a concave surface, and the measuring light from the target optical system is reflected on the concave surface.

14. A measuring apparatus according to claim 1, further comprising:
a fluid supply system for supplying the fluid to a space between the target optical system and said reflection unit; and
a fluid recovery system for recovering the fluid from the space.

15. A measuring apparatus according to claim 1, wherein the fluid is stationary at least during a measuring time.

16. A measuring apparatus according to claim 1, wherein a difference of a refractive index between the fluid and the reflection unit is smaller than 0.15.

17. An exposure apparatus comprising:
an illumination optical system for illuminating a reticle;
a projection optical system for projecting a pattern of the reticle onto a substrate; and
a measuring apparatus for measuring optical performance of said projection optical system
wherein said measuring apparatus includes:
an optical unit for splitting light from a light source into measuring light and reference light so that the measuring light can be introduced into said projection optical system;
a reflection unit for reflecting the measuring light from the projection optical system toward the projection optical system via a fluid; and
a detector for detecting an interference fringe generated between interference between the measuring light that has emitted from said projection optical system after being reflected by said reflection unit and the reference light that does not pass said projection optical system;
wherein said reflection unit is a condenser optical system that provides a condensing point on an image plane of the projection optical system; and
wherein the fluid meets $V > D \times X$, where V is a constant moving speed of the fluid, D is a maximum width (mm) of the measuring light in the fluid, and X is a detecting frame rate (Hz) of said detector.

18. A device manufacturing method comprising the steps of:
exposing a substrate using an exposure apparatus according to claim 17; and
developing the object that has been exposed.

* * * * *